(12) United States Patent
Francis et al.

(10) Patent No.: US 6,627,961 B1
(45) Date of Patent: Sep. 30, 2003

(54) HYBRID IGBT AND MOSFET FOR ZERO CURRENT AT ZERO VOLTAGE

(75) Inventors: Richard Francis, Manhattan Beach, CA (US); Ranadeep Dutta, Redondo Beach, CA (US); Chiu Ng, El Segundo, CA (US); Peter Wood, Rolling Hills Estates, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/565,151

(22) Filed: May 5, 2000

(51) Int. Cl.[7] ............................................. H01L 29/72
(52) U.S. Cl. ...................... 257/378; 257/379; 257/391; 257/544
(58) Field of Search ................. 257/378, 379, 257/391, 544

(56) References Cited

U.S. PATENT DOCUMENTS

| | | |
|---|---|---|
| 4,901,127 A | 2/1990 | Chow et al. |
| 5,178,370 A | 1/1993 | Clark et al. |
| 5,569,982 A * | 10/1996 | Nadd .......................... 257/378 |
| 5,689,208 A * | 11/1997 | Nadd .......................... 257/378 |
| 5,814,884 A * | 9/1998 | Davis et al. ................. 257/378 |
| 5,851,857 A * | 12/1998 | Kelberlau et al. .......... 257/378 |
| 5,900,662 A | 5/1999 | Frisina et al. |

* cited by examiner

Primary Examiner—Edward Wojciechowicz
(74) Attorney, Agent, or Firm—Ostrolenk, Faber, Gerb & Soffen, LLP

(57) ABSTRACT

A high voltage MOSgated semiconductor device has a generally linear MOSFET type forward current versus forward voltage characteristic at low voltage and the high current, low forward drop capability of an IGBT. The device is particularly useful as the control transistor for a television tube deflection coil. The device is formed by a copacked discrete IGBT die and power MOSFET die in which the ratio of the MOSFET die area is preferably about 25% that of the IGBT. Alternatively, the IGBT and MOSFET can be integrated into the same die, with the IGBT and MOSFET elements alternating laterally with one another and overlying respective $P^+$ injection regions and $N^+$ contact regions respectively on the bottom of the die. The MOSFET and IGBT elements are preferably spaced apart by a distance of about 1 minority carrier length (50-100 microns for a 1500 volt device).

25 Claims, 2 Drawing Sheets

HYBRID IGBT AND MOSFET FOR ZERO CURRENT AT ZERO VOLTAGE

FIELD OF THE INVENTION

This invention relates to MOSgated transistors and more specifically relates to a hybrid transistor consisting of the parallel connection of an IGBT and a power MOSFET.

BACKGROUND OF THE INVENTION

MOSgated transistors such as power MOSFETs and Insulated Gate Bipolar Transistors (IGBTs) are well known and have numerous advantages over conventional junction type bipolar transistors, including a simpler drive circuit. However, in certain applications, for example, for the drive of a CRT or TV deflection coil, a high voltage MOSFET has too high an on-resistance, while an IGBT forward conduction characteristic does not provide the necessary linearity near zero voltage and zero current.

It would be desirable to provide a MoSgated device for use in high voltage (for example, 1,500 volts) circuits and which exhibit good linear behavior at low voltage and low current.

BRIEF DESCRIPTION OF THE INVENTION

In accordance with the invention, a parallel connected power MOSFET and IGBT are used to define a high voltage MOSgated transistor which will have the low forward voltage drop of the IGBT and the linearity of the MOSFET at low voltage whereby the device can be used in place of a bipolar transistor in a TV deflection coil drive circuit or the like.

The novel device can be implemented by a copacked IGBT and power MOSFET die in a common package, as in the manner of the Schottky diode and MOSFET die in U.S. Pat. No. 5,814,884; or the MOSFET and IGBT can be integrated into a common die. In either case, the total MOSFET area is preferably about 50% that of the IGBT area and can range from 10% to 100%.

In a preferred integrated embodiment of the invention, a conventional D-MOS structure is formed on the top surface of an $N^-$ silicon die. The D-MOS structure spaced bases are then aligned vertically with alternate $N^+$ MOSFET contact regions and $P^+$ IGBT collector regions. The $N^+$ contact regions and $P^+$ collector regions are preferably spaced by about a 1 minority carrier diffusion length. These regions may be activated as by a laser anneal. A single bottom contact, preferably aluminum, then contacts the bottom regions to complete the integrated device.

DETAILED DESCRIPTION OF THE DRAWINGS

Figure 1:
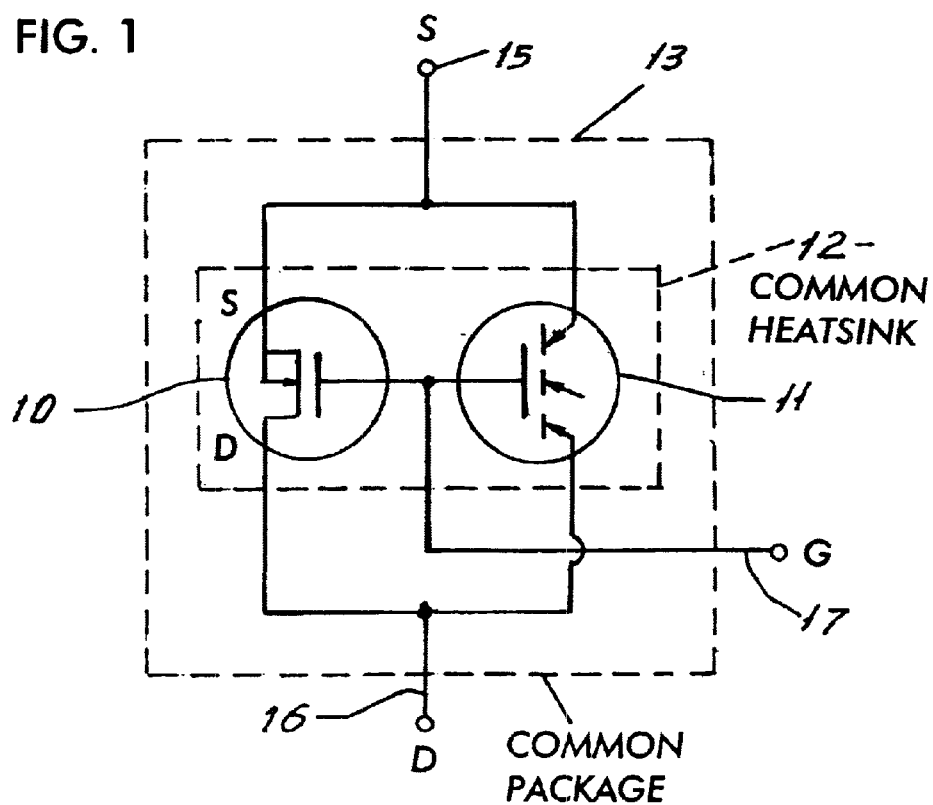
FIG. 1 is a circuit diagram of the device of the invention and schematically illustrates copacked die.

Referring first to FIG. 1, there is shown a copacked MOSFET die 10 and an IGBT die 11 both mounted on a common lead frame support 12, schematically shown in dotted lines. The die and suitable bond wires to lead frame pins are then housed by a transfer molded housing 13 in the manner shown in U.S. Pat. No. 5,814,884.

Leads or pins 15, 16 and 17 extend from housing 13 and correspond to the source, drain and gate lead respectively for MOSFET 10, and emitter, collector and gate respectively for IGBT 11.

Preferably, the MOSFET die 10 will have an area of 10 to 100% of that of IGBT die 11.

Figure 2:
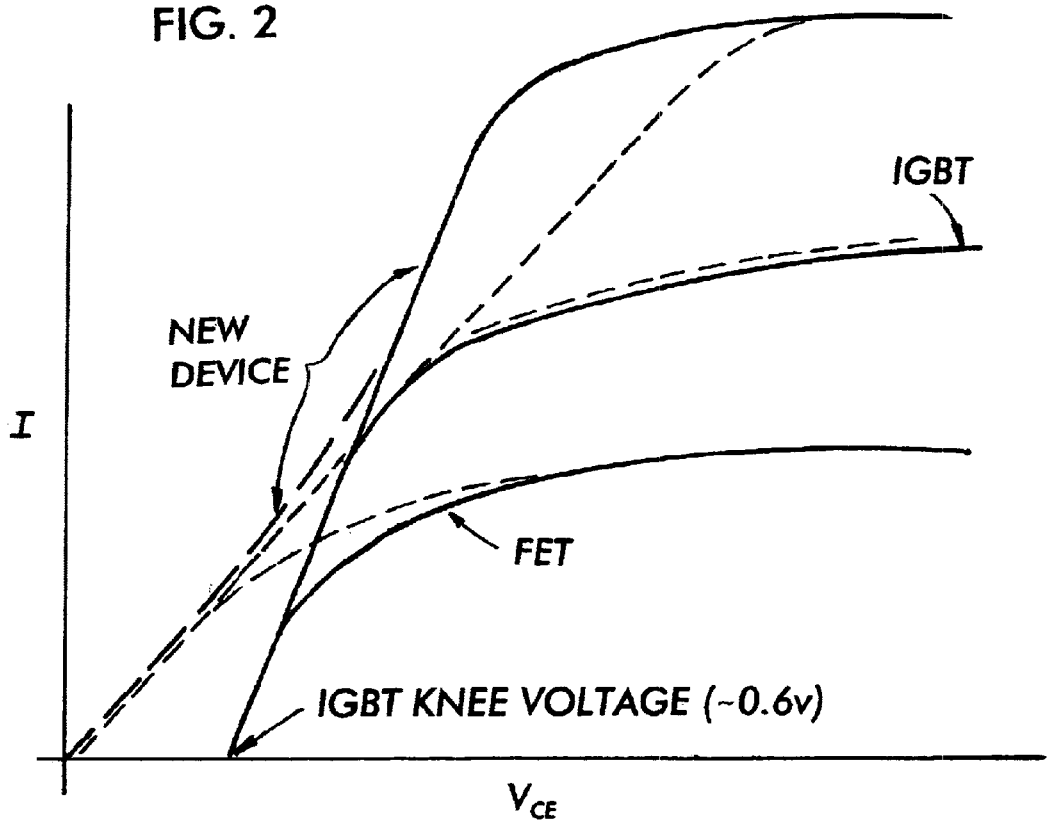
FIG. 2 shows the forward voltage and forward current characteristics of the devices of FIG. 1.

The forward voltage characteristics of the components of FIG. 1 are shown in FIG. 2. At low forward voltage, the MOSFET 10 linear characteristics predominate, as shown in dotted line 30. However, at higher forward current, the IGBT 11 low forward voltage drop characteristics (in solid line) will predominate. the circuit of FIG. 1 is operable in circuits which are presently served only by bipolar transistors.

Figure 3:
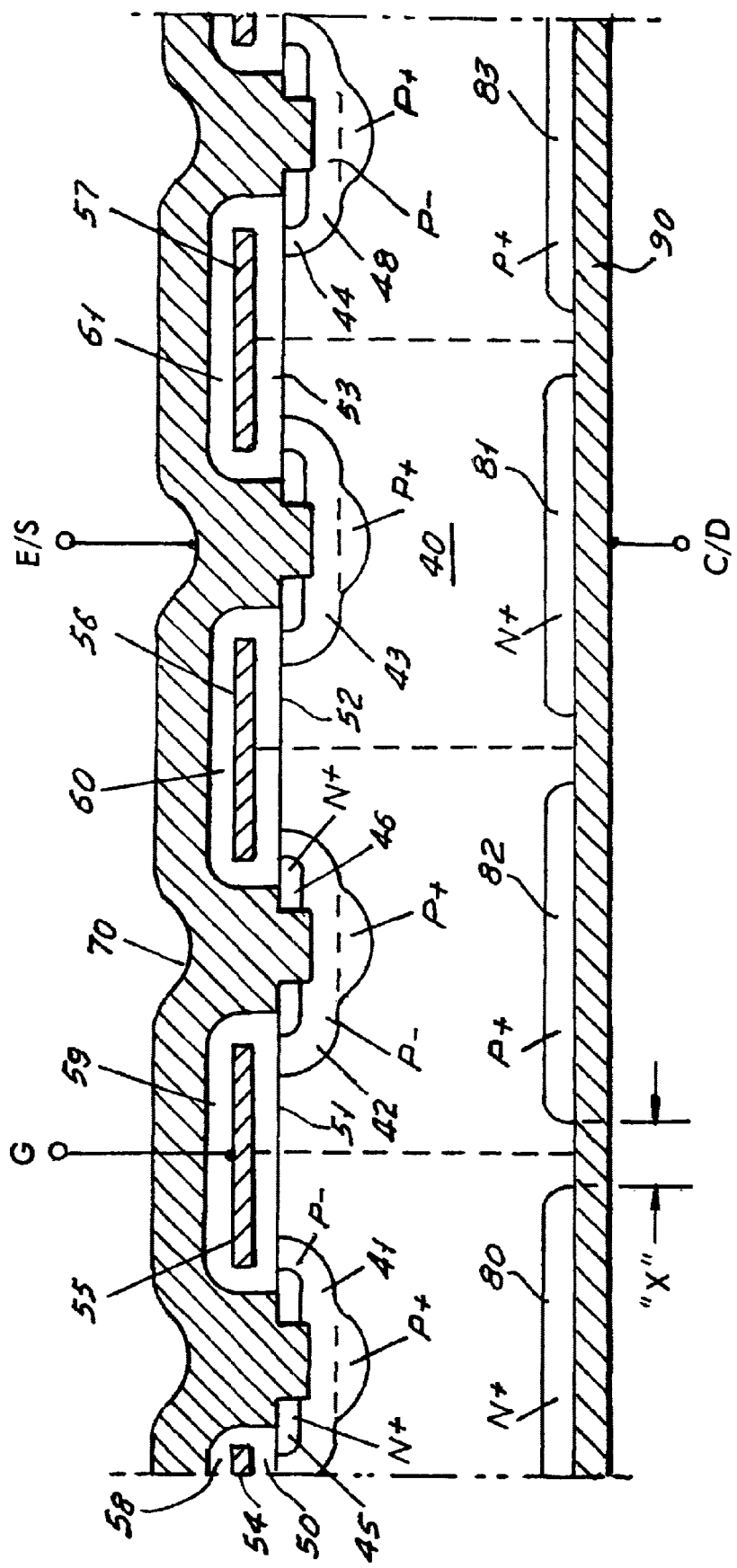
FIG. 3 is a cross-section of a small portion of the active area of an integrated MOSFET and IGBT in accordance with the invention.

FIG. 3 shows an embodiment of the invention in which the MOSFET 10 and IGBT 11 of FIG. 1 are integrated into a common die. Thus, in FIG. 3, an $N^-$ die 40, which may be a float zone silicon die, has a top surface which contains a D-MOS type structure in its active area. Thus, a plurality of P-diffusions 41, 42, 43 and 44 which have conventional centrally deep $P^+$ diffusions. Each of bases 41 to 44 may be identical and may have a polygonal cellular, or parallel stripe geometry. The bases may also have different areas from one another or different shapes, if desired. Each bases 41 to 44 receive $N^+$ source diffusions 45 to 48 respectively to define invertible P-channel regions which are covered by gate oxide segments 50 to 53 which are, in turn, covered by conductive polysilicon gate segments 54 to 57 respectively.

The polysilicon gate segments, which are parts of a polygonal mesh if the bases are cellular, or are stripes if the bases are stripes, are then covered by low temperature oxide (LTO) segments 58 to 61 respectively, which are in turn covered by a top aluminum electrode 70 which will be the emitter/source electrode of the device.

After completing the top structure the die (or wafer in which it resides) is ground down to 200 to 300 microns thick, depending on the voltage rating of the device. The bottom surface of die 40 receives $N^+$ diffusions 80 and 81 which are in vertical alignment with respective 41 and 43, thus defining $N^+$ contact regions for vertical conduction MOSFET elements of the integrated structure. $P^+$ regions 82 and 83 are next diffused into the bottom of wafer 40 and in alignment with bases 42 and 44 respectively, to act as the emitter regions of IGBT elements.

The regions 80 to 84 are spaced from adjacent regions by about 1 minority carrier diffusion length (about 50–100 microns).

The regions 80 to 84 may be activated by a laser anneal or the like.

A back contact 90, which may be aluminum covered by other contact metals may then be formed on the bottom surface to act as the drain/collector contact of the integrated device.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A Mosgated device for driving a TV deflection coil, comprising:

an IGBT and power MOSFET having outputs coupled together in parallel with a base and gate node of said IGBT and MOSFET, respectively, being coupled together, such that said device has at least three nodes;

said IGBT and MOSFET having respective effective die areas totalling less than an entire device die area;

said MOSFET effective die area being from 10% to 100% that of said IGBT;

said coupled IGBT and MOSFET permitting said device to have a linear characteristic of a power MOSFET at low forward current and low forward voltage; and said coupled IGBT and MOSFET permitting said device to have a low forward voltage drop at high current characteristic of an IGBT.

2. The device of claim 1 wherein said device has the characteristics of a bipolar transistor but has a linear characteristic passing through the zero voltage, zero current origin of its characteristic curve.

3. The device of claim 1 wherein said IGBT and power MOSFET die are discrete die which are copacked on a common heat sink in a common housing.

4. The device of claim 2 wherein said IGBT and power MOSFET die are discrete die which are copacked on a common heat sink in a common housing.

5. The device of claim 1 wherein said IGBT and power MOSFET are integrated into a common die.

6. The device of claim 2 wherein said IGBT and power MOSFET are integrated into a common die.

7. The device of claim 1 wherein said MOSFET effective die area is about 50% that of said IGBT effective die area.

8. The device of claim 2 wherein said MOSFET effective die area is about 50% that of said IGBT effective die area.

9. The device of claim 3 wherein said MOSFET effective die area is about 10–100% that of said IGBT effective die area.

10. The device of claim 4 wherein said MOSFET effective die area is about 10–100% that of said IGBT effective die area.

11. The device of claim 6 wherein said MOSFET effective die area is about 10–100% that of said IGBT effective die area.

12. A MOSgated transistor having linear characteristics at and near zero forward current and zero forward voltage; said Mosgated transistor comprising an IGBT and MOSFET having outputs coupled together in parallel with a base and gate node coupled together; said IGBT and MOSFET having respective effective die areas totalling less than an entire device die area; said MOSFET effective die area being from 10 to 100% that of said IGBT; said coupled IGBT and MOSFET permitting said device to have a characteristic of a power MOSFET at low forward current and low forward voltage, and said coupled IGBT and MOSFET permitting said device to have a low forward voltage drop characteristic of an IGBT at high forward voltage.

13. The device of claim 12 wherein said IGBT and power MOSFET die are discrete die which are copacked on a common heat sink in a common housing.

14. The device of claim 12 wherein said IGBT and power MOSFET are integrated into a common die.

15. The device of claim 12 wherein said MOSFET effective die area is about 10–100% that of said IGBT effective die area.

16. The device of claim 13 wherein said MOSFET effective die area is about 10–100% that of said IGBT effective die area.

17. The device of claim 14 wherein said MOSFET effective die area is about 10–100% that of said IGBT effective die area.

18. A MOSgated transistor comprising a thin silicon die of one conductivity type and having a top surface and a bottom surface; said top surface having a plurality of spaced base diffusions of another conductivity type therein; each of said spaced base diffusions having respective source diffusions of said one conductivity type therein to define respective invertible channel regions; a gate oxide layer atop each of said invertible channel regions and a conductive polysilicon gate layer atop said gate oxide layer, whereby control signals on said conductive gate layer are operable to turn on said invertible channel regions; first diffusions of increased concentration of said one conductivity type disposed in said bottom surface and in vertical alignment with respective ones of a first group of said plurality of base diffusions and defining a MOSFET drain contact diffusion; second diffusions of said another conductivity type spaced from said first diffusions and disposed in said bottom surface and in vertical alignment with a second group of said plurality of spaced base diffusions and defining the collector region for an IGBT; a conductive contact disposed atop and insulated from said gate electrode and connected to each of said base and source diffusions; and a second conductive contact connected to each of said first and second diffusions to define a MOSFET drain contact to said first plurality of diffusions and an IGBT collector contact to said second plurality of diffusions.

19. The transistor of claim 18 wherein at least a subplurality of said base diffusions are polygonal cells.

20. The transistor of claim 18 wherein at least a subplurality of said base diffusions are elongated stripes.

21. The transistor of claim 19 wherein each of said polygonal cells are arranged in a symmetrical pattern in which at least selected ones of said first group of base diffusions are adjacent to and spaced from at least selected ones of said second group of base diffusions by a spacing greater than about the diffusion length of one minority carrier.

22. The transistor of claim 18 wherein each of said plurality of base diffusions have an identical structure.

23. The transistor of claim 18 wherein said one conductivity type is N and said other conductivity type is P.

24. The transistor of claim 18 wherein the total area occupied by said first group of diffusions is from 10% to 100% of the area of said second group of base diffusions.

25. The transistor of claim 24 wherein said total area occupied by said first group of diffusions is about one half of that of said second group of base diffusions.

* * * * *